United States Patent
Sepp et al.

(10) Patent No.: US 6,836,738 B2
(45) Date of Patent: Dec. 28, 2004

(54) METHOD FOR OPTIMIZED RENDERING OF EYE DIAGRAMS SYNCHRONIZED TO A RECOVERED CLOCK AND BASED ON A SINGLE SHOT ACQUISITION

(75) Inventors: Kalev Sepp, Portland, OR (US); John C. Calvin, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/389,545

(22) Filed: Mar. 14, 2003

(65) Prior Publication Data

US 2004/0002826 A1 Jan. 1, 2004

Related U.S. Application Data

(60) Provisional application No. 60/364,794, filed on Mar. 14, 2002.

(51) Int. Cl.[7] .................... G01R 29/02; G01R 13/02
(52) U.S. Cl. ................................... 702/67; 702/73
(58) Field of Search .................... 702/66–69, 189, 702/73; 398/27

(56) References Cited

U.S. PATENT DOCUMENTS

| | | | | |
|---|---|---|---|---|
| 6,430,235 B1 | * | 8/2002 | O'Shea et al. | 375/326 |
| 6,583,903 B1 | * | 6/2003 | Way et al. | 398/152 |
| 6,639,461 B1 | * | 10/2003 | Tam et al. | 330/10 |

* cited by examiner

*Primary Examiner*—Marc S. Hoff
*Assistant Examiner*—Paul L Kim
(74) *Attorney, Agent, or Firm*—Thomas F. Lenihan

(57) ABSTRACT

A first method for rendering an eye diagram synchronized to a recovered clock and based on a single shot acquisition of a digital storage oscilloscope, acquires a waveform and measures the timing of its edges. It then estimates the symbol rate of the waveform and derives clock signals in accordance with the edge timing and the estimated symbol rate. The waveform data is then sliced into frames with respect to the derived clock signals, and the frames are partially overlapped and aligned to form an eye diagram. In a second embodiment of the invention, the frames are aligned, without being overlapped, to form an eye diagram.

6 Claims, 5 Drawing Sheets

# METHOD FOR OPTIMIZED RENDERING OF EYE DIAGRAMS SYNCHRONIZED TO A RECOVERED CLOCK AND BASED ON A SINGLE SHOT ACQUISITION

CLAIM FOR PRIORITY

The subject application claims priority from U.S. Provisional Patent Application No. 60/364,794, entitled METHOD FOR OPTIMIZED RENDERING OF EYE DIAGRAMS SYNCHRONIZED TO A RECOVERED CLOCK BASED ON A SINGLE SHOT ACQUISITION (Sepp, et al.) filed 14 Mar. 2002, and herein incorporated by reference in its entirety.

FIELD OF THE INVENTION

The subject invention concerns the Field of Eye Diagram Rendering in general, and specifically concerns the optimized rendering of eye diagrams synchronized to a recovered clock and based on a single shot acquisition of a digital storage oscilloscope.

BACKGROUND OF THE INVENTION

The rendering of Eye Diagrams on signals acquired by a Digital Storage Oscilloscope (DSO) is well known in the art. U.S. Pat. No. 5,343,405 (Kucera), issued 30 Aug. 1994 and assigned to the same assignee as the subject invention, is an early patent describing such a system.

Unfortunately, current methods used in modern DSOs for rendering eye diagrams exhibit significant deficiencies. For example, they do not support suitably high data rates relative to scope bandwidth and maximum sampling rate (currently OC-48 data rates at 2.4–2.5 Gb/s for 4 GHz bandwidth 20G samples/s oscilloscopes). In real time oscilloscopes, they are subject to instrument trigger jitter.

When used in sampling oscilloscopes these methods require periodic signals and stable clock or clock recovery. What is needed is a method of rendering of eye diagrams in a digital storage oscilloscope that overcomes the above-noted deficiencies.

SUMMARY OF THE INVENTION

In a first embodiment of the invention, a first method, suitable for use in a digital storage oscilloscope for rendering an eye diagram synchronized to a recovered clock and based on a single shot acquisition, acquires a waveform and measures the timing of its edges. It then estimates the symbol rate of the waveform and derives clock signals in accordance with the edge timing and the estimated symbol rate. The waveform data is then sliced into frames with respect to the derived clock signals, and the frames are partially overlapped and aligned to form an eye diagram.

In a second embodiment of the invention, a second method, suitable for use in a digital storage oscilloscope for rendering an eye diagram synchronized to a recovered clock and based on a single shot acquisition, acquires a waveform and measures the timing of its edges. It then estimates the symbol rate of the waveform and derives clock signals in accordance with the edge timing and the estimated symbol rate. The waveform data is then sliced into frames with respect to the derived clock signals, and the frames aligned, without being overlapped, to form an eye diagram.

DETAILED DESCRIPTION OF THE EMBODIMENTS

The subject invention is an optimized method of rendering eye diagrams for signals with encoded clocks. The data is acquired with a real-time oscilloscope in single shot mode so as to acquire a large population of bit symbols along with the encoded clock information. It is herein recognized that the method of the subject invention is suitable for jitter analysis and mask compliance testing.

The method of the subject invention takes advantage of two important features of modern real-time oscilloscopes. One of these features is long waveform acquisition capability. For example, the TDS 7404 oscilloscope, manufactured by Tektronix, Inc., Beaverton, Oreg. can acquire 32 million samples. A second feature is the high sample rate capability of the TDS 7404 oscilloscope making it suitable for real time acquisition of telecom and datacom signals.

Figure 1:
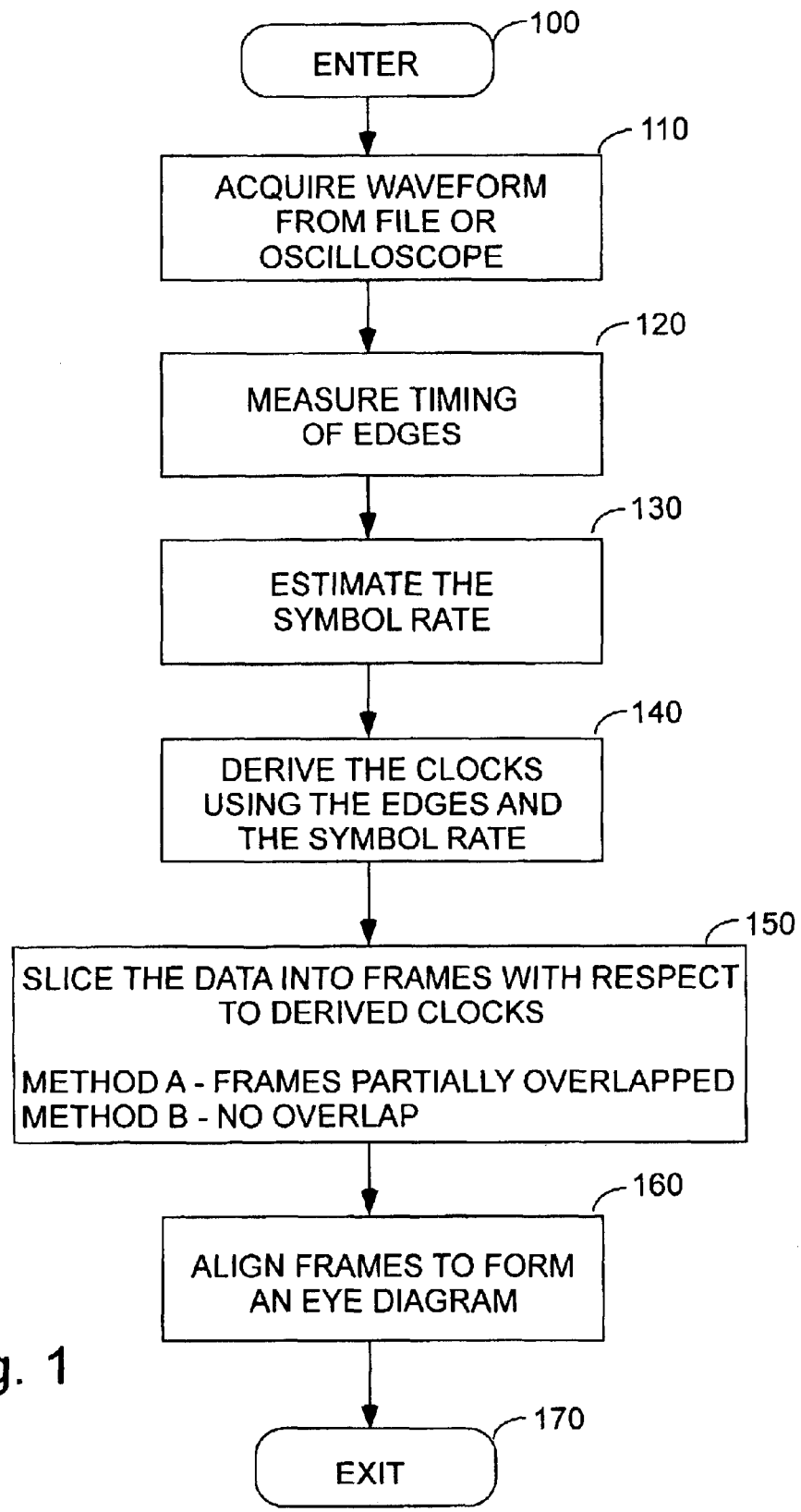
FIG. 1 is a flowchart showing the steps of the invention.

A first portion of the algorithm for synchronized eye rendering shown in FIG. 1 is based on an algorithm for a Time Interval Error (TIE, or jitter) calculation. The method is entered at step 100, and advances to step 110 wherein a waveform is acquired from a file or from an oscilloscope. At step 120, the locations of the edges of the waveform are measured. One skilled in the art will realize that each sample acquired is stored as an amplitude value having a unique timestamp. The symbol rate is then estimated at step 130. The method then advances to step 140 wherein the clock signals are derived (reconstructed) using the edge information and the estimated symbol rate. At step 150, the waveform data is sliced into frames with respect to the derived clock signals. At this point, one of two procedures (i.e., one of Method A or Method B) may be applied. Either the frames are partially overlapped in time, or they are not. At step 160, the frames are aligned to form an eye diagram for display on the oscilloscope screen, and the method is exited at step 170. The alignment is accomplished by use of the same time marks corresponding to the reconstructed clock signals.

Figure 2A:
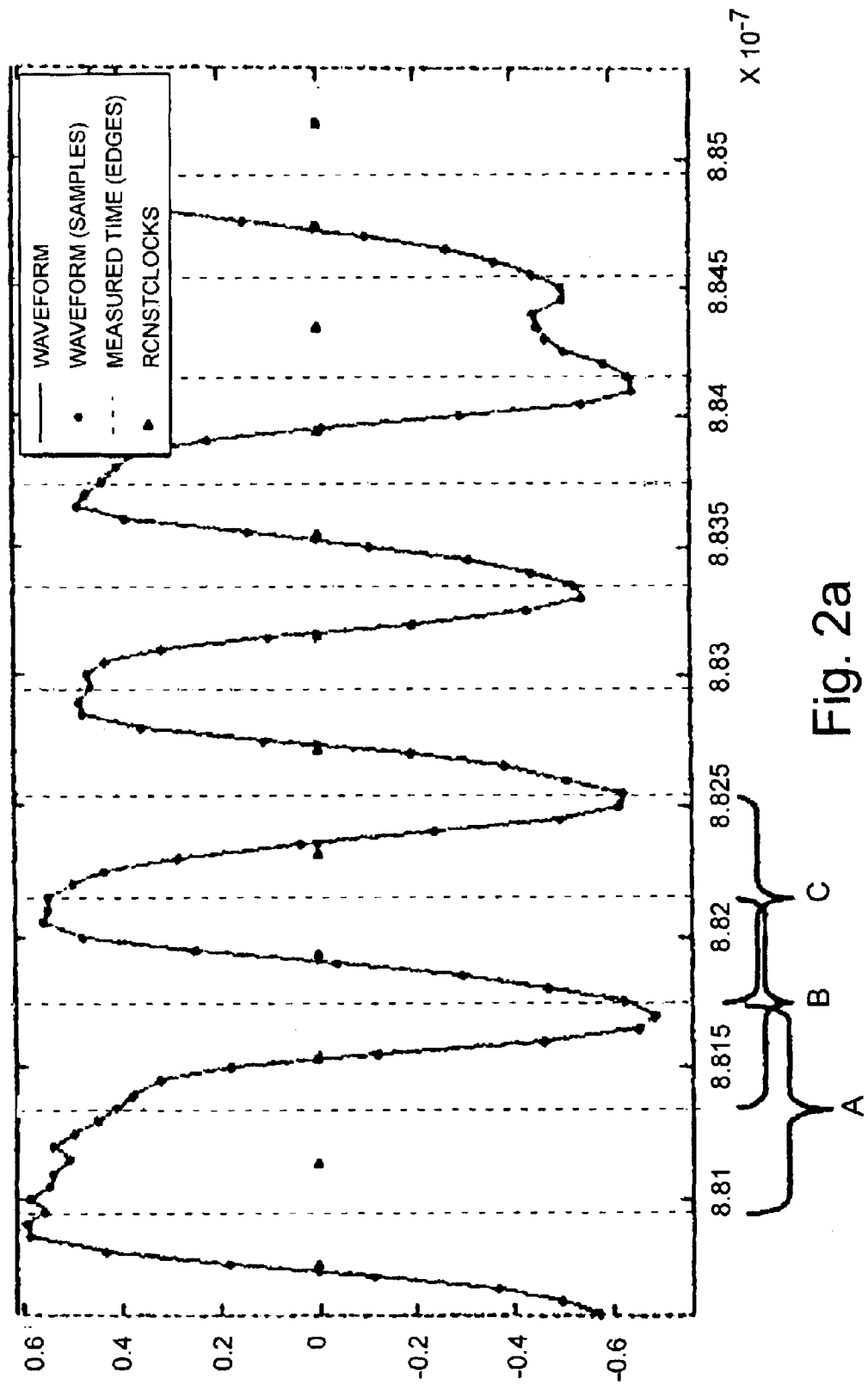
FIG. 2a is an illustration of a screen display of an oscilloscope showing an acquired waveform in accordance with a first embodiment of the invention.
Figure 2B:
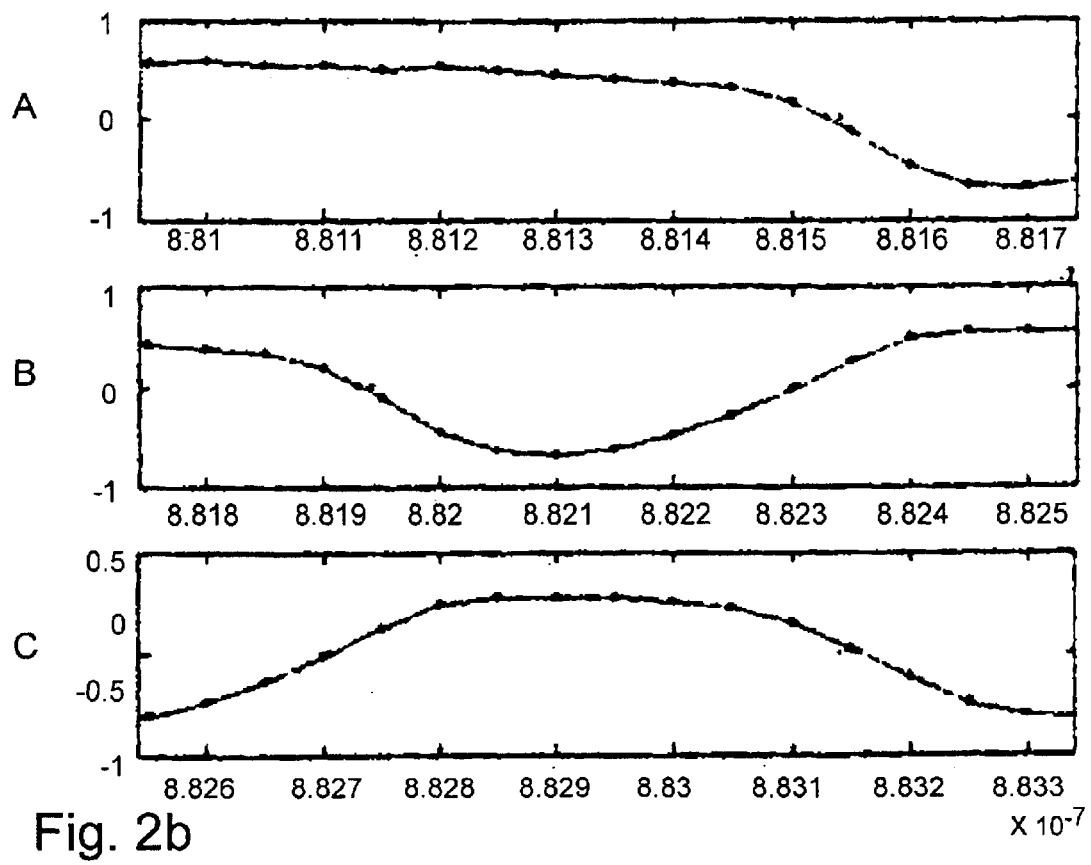
FIG. 2b is an illustration of separate frames of the waveform of FIG. 2a in accordance with the first embodiment of the invention.
Figure 2C:
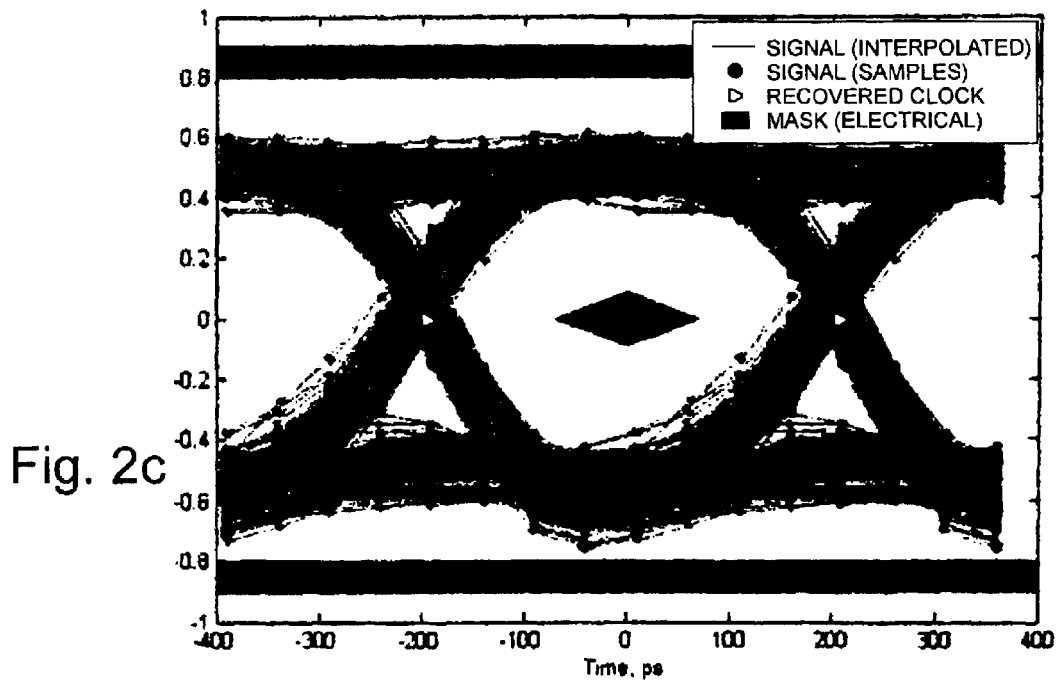
FIG. 2c is an illustration of a screen display of an oscilloscope showing an eye diagram constructed in accordance with the first embodiment of the invention.
Figure 3A:
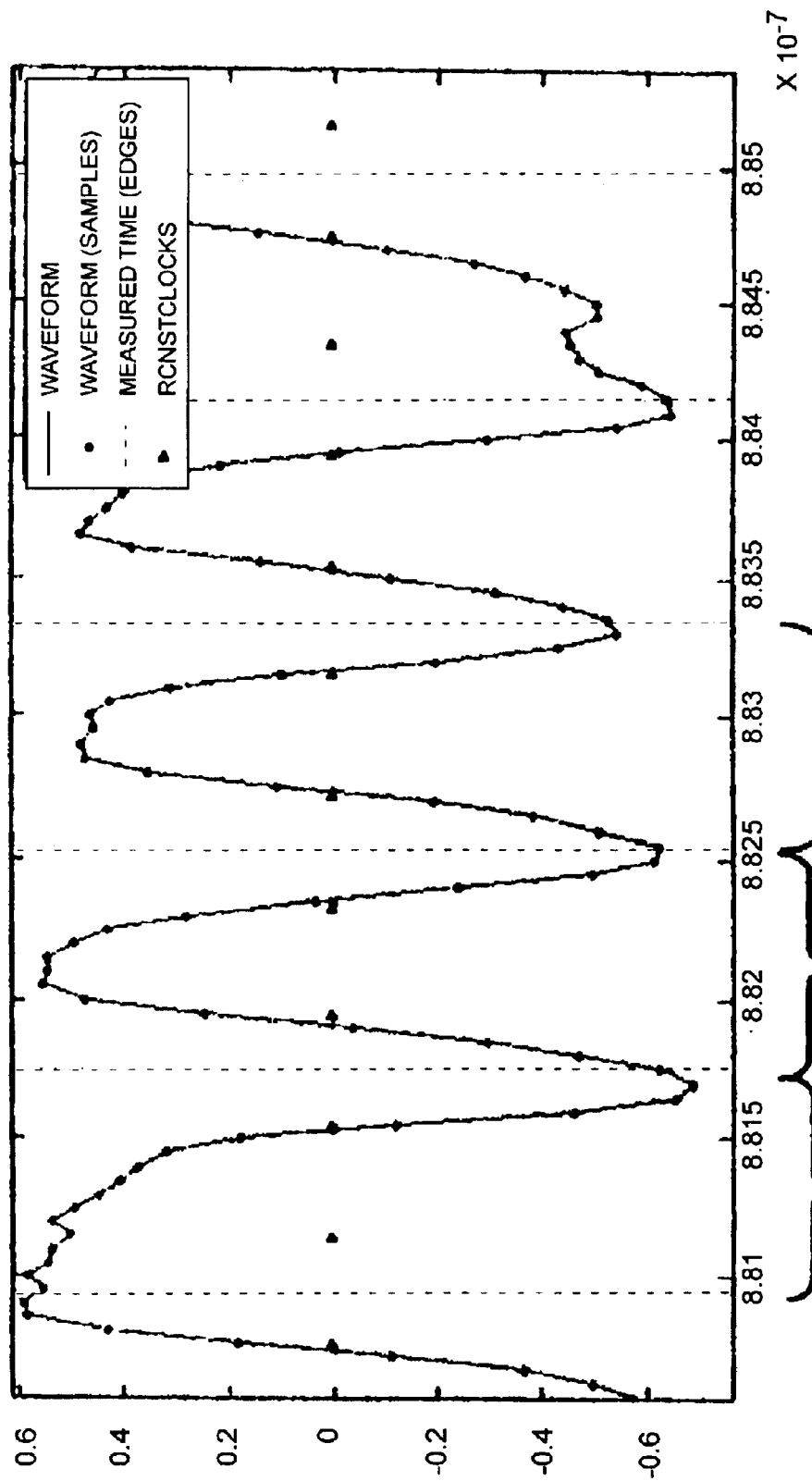
FIG. 3a is an illustration of a screen display of an oscilloscope showing an acquired waveform in accordance with a second embodiment of the invention.
Figure 3B:
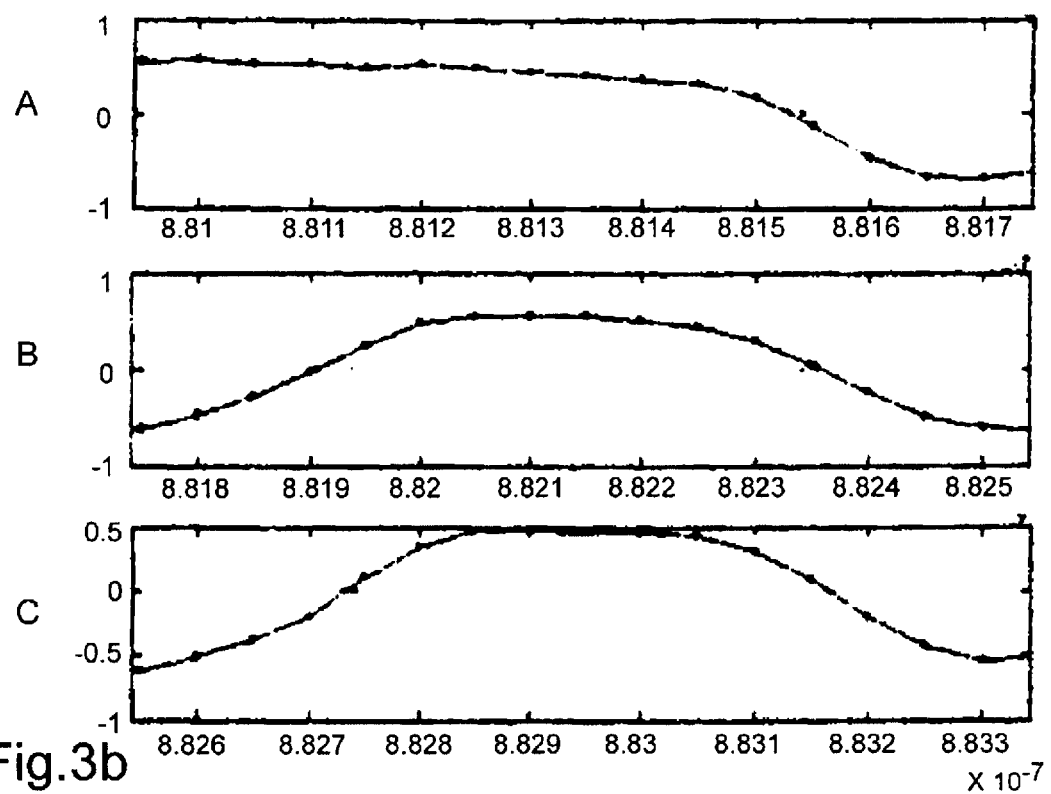
FIG. 3b is an illustration of separate frames of the waveform of FIG. 3a in accordance with the second embodiment of the invention.
Figure 3C:
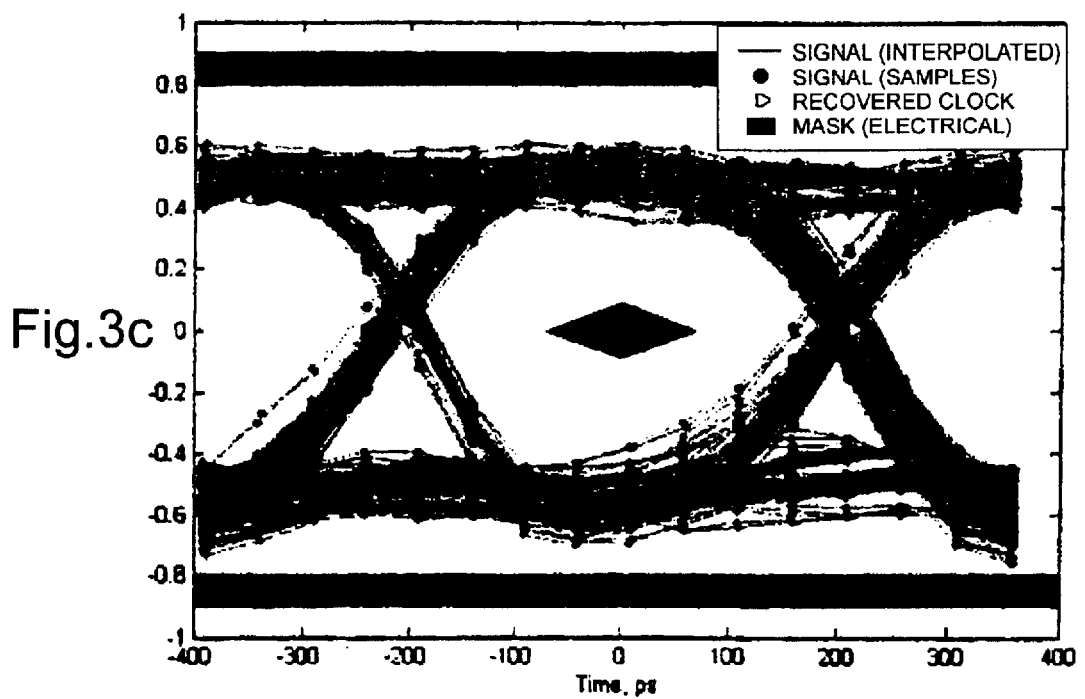
FIG. 3c is an illustration of a screen display of an oscilloscope showing an eye diagram constructed in accordance with the second embodiment of the invention.

The slicing (step 150) and alignment (step 160) procedures of the algorithm are shown in FIGS. 2a, 2b, 2c and FIGS. 3a, 3b, 3c. FIGS. 2C and 3c show eye diagrams synchronized to the recovered (i.e., derived or reconstructed) clock. As noted above, there are two methods for use depending upon whether the waveform frames are to be overlapped or not. In Method A, the frames A, B, C of FIG. 3a are adjacent (do not overlap), therefore when combining the frames to produce the eye diagram of FIG. 3c, the frames are not overlapped. Method A (not overlapped) requires more memory and processing time but is more suitable for measurements that are based on the eye diagram. In contrast, in Method B, the frames A, B, C of FIG. 2a overlap, therefore when combining the frames to produce the eye diagram of FIG. 2c, the frames are overlapped to the same degree. Note that the time scale (x-axis) of FIGS. 2c and 3c is a relative time scale centered on zero picoseconds to facilitate alignment of the frames. If desired, a mask may be superimposed on the eye diagram as shown in FIGS. 2c and 3c.

The method of the subject invention overcomes the deficiencies of traditional eye diagrams noted above. In particular, the subject method is suitable for handling high data rates relative to scope bandwidth and maximum sampling rate. It eliminates the effect of instrument trigger jitter in real-time oscilloscopes. It eliminates the need for periodic signals with equivalent time (ET) modes of oscilloscopes operation. It eliminates the need for periodic signals and stable clock or clock recovery required by sampling oscilloscopes. It is subject only to acquisition clock accuracy, a criterion that is several orders of magnitude less than trigger jitter.

Moreover, the method of the subject invention displays every sample within the long waveform to make compliance testing more reliable. That is, the subject invention circumvents triggering and rearming delays that plague Equivalent Time (ET) methods of rendering eye diagrams. It is important to note that the method of the subject invention allows correlation between eye diagram violations and the temporal location of the offending event within the acquisition. For example, in a given situation one may observe that an eye diagram failure always occurs at the end of a packet. The method does not require high-speed clock recovery circuitry, and in fact, can be implemented in software only. Finally, the subject method is suitable for SERDES and PLL design and calibration.

What is claimed is:

1. A method, suitable for use in a digital storage oscilloscope, for rendering an eye diagram, comprising the steps of:
   acquiring a single shot acquisition of a waveform;
   measuring timing of edges of said acquired waveform;
   estimating a symbol rate of said acquired waveform;
   deriving a clock signal in accordance with said measured edge timing and said estimated symbol rate;
   slicing said acquired waveform into frames with respect to said derived clock signals;
   partially overlapping said frames in time; and
   aligning said partially overlapped frames to form an eye diagram.

2. The method of claim 1, wherein said acquisition is a long memory acquisition, and substantially all samples of said acquisition are displayed in said eye diagram.

3. The method of claim 2, further comprising the step of:
   correlating between an eye diagram violation and a temporal location of an event within said acquisition.

4. A method, suitable for use in a digital storage oscilloscope, for rendering an eye diagram, comprising the steps of:
   acquiring a single shot acquisition of a waveform;
   measuring timing of edges of said acquired waveform;
   estimating a symbol rate of said acquired waveform;
   deriving a clock signal in accordance with said measured edge timing and said estimated symbol rate;
   slicing said acquired waveform into frames with respect to said derived clock signals; and
   aligning said partially overlapped frames to form an eye diagram.

5. The method of claim 4, wherein said acquisition is a long memory acquisition, and substantially all samples of said acquisition are displayed in said eye diagram.

6. The method of claim 5, further comprising the step of:
   correlating between an eye diagram violation and a temporal location of an event within said acquisition.

* * * * *